US005929623A

United States Patent [19]

Hoshino

[11] Patent Number: 5,929,623

[45] Date of Patent: Jul. 27, 1999

[54] REGULATED POWER SUPPLY CIRCUIT

[75] Inventor: Taichi Hoshino, Kyoto, Japan

[73] Assignee: Rohm Co., Ltd., Kyoto, Japan

[21] Appl. No.: 09/159,675

[22] Filed: Sep. 24, 1998

[30] Foreign Application Priority Data

Sep. 25, 1997 [JP] Japan .................................... 9-278045

[51] Int. Cl.[6] ................................ G05F 3/16; H03H 3/45

[52] U.S. Cl. ............................................ 323/315; 330/257

[58] Field of Search .................................... 323/312, 313, 323/315, 316; 330/257, 288; 327/538, 539, 544

[56] References Cited

U.S. PATENT DOCUMENTS

| | | | |
|---|---|---|---|
| 5,327,100 | 7/1994 | Stockstad et al. | 330/257 |
| 5,422,600 | 6/1995 | Petty et al. | 330/257 |
| 5,589,794 | 12/1996 | McClure | 327/538 |
| 5,637,993 | 6/1997 | Whitney et al. | 323/315 |
| 5,786,729 | 6/1998 | Smith | 330/255 |

*Primary Examiner*—Matthew Nguyen
*Attorney, Agent, or Firm*—Fay, Sharpe, Beall, Fagan, Minnich & McKee

[57] ABSTRACT

A regulated power source circuit is provided with a current output circuit including a drive stage transistor which operates when receiving at the input side thereof an output signal from one of transistor for differential operation in a differential amplifier circuit, a current output stage transistor which is driven by the drive stage transistor and a detection circuit which detects a drive current value of the drive stage transistor, and further a dummy circuit which causes to output from the other transistor forming a pair with the one transistor in the differential amplifier circuit a current the value of which is substantially equal to that of the current outputted from the one transistor in the differential amplifier circuit to the drive stage transistor when a detection signal from the detection circuit is received.

6 Claims, 2 Drawing Sheets

REGULATED POWER SUPPLY CIRCUIT

BACKGROUND OF THE INVENTION

1. Field of the Invention

The present invention relates to a regulated power supply circuit and, more specifically, to a regulated power supply circuit which prevents lowering of the regulation range even when a load current increases as well as suppresses lowering of the output voltage which is contrary to a conventional regulator outputting a regulated electric power of which regulation range is normally narrowed and decreases correspondingly depending on an increase of the load current.

2. Background Art

As an example of conventional CMOS type regulated power supply circuits formed in an IC, a power source voltage regulation circuit (regulator) as illustrated in FIG. 3 is exemplified which is constituted by a differential amplifier circuit 10 and a current output circuit (a current booster circuit) 11 making use of a bipolar transistor at the output stage thereof.

In this circuit, numeral 12 is an output terminal at which a regulated voltage is provided and to which a load L is connected. Numeral 13 is a constant voltage power source generating a reference voltage Vr which is applied to one input of the differential amplifier circuit 10. The differential amplifier circuit 10 includes inside thereof a differential amplifier 10*a* and a constant current source 10*b* having a current value of I. Further, at the output side of the current booster circuit 11 a series circuit of resistors R1 and R2 is inserted between the output terminal 12 and the ground GND in parallel with the load L.

Herein, the differential amplifier 10*a* includes a pair of PNP type bipolar transistors Q1 and Q2 which perform a differential operation and NPN type bipolar transistors Q3 and Q4 in a current mirror connection which are provided between collectors of the respective bipolar transistors Q1 and Q2 and the ground GND as an active load. To the base of the transistor Q1 the reference voltage Vr is applied, the both emitters of the bipolar transistors Q1 and Q2 are connected in common and are connected via a constant current source 10*b* to a predetermined power source line VDD which is roughly regulated by such as a capacitor.

The base of the transistor Q2 is connected to a junction point N of the resistors R1 and R2 and receives a fed back voltage from the output side of the current booster circuit 11. Further, the output derived from the collector side of the transistor Q4 is applied to the base of an NPN type bipolar transistor Q5 at the input stage in the current booster circuit 11. The transistor Q5 is one for driving a current output stage transistor Q6, and of which emitter is grounded and of which collector is connected to the base of the PNP type bipolar transistor Q6 at the current output stage as well as to a power source line Vcc which is higher than the predetermined power source line VDD through a resistor R3. The transistor Q5 drives the transistor Q6 in response to an output current derived from the collector side of the transistor Q4. Still further, the emitter of the transistor Q6 is connected to the output terminal 12.

In this circuit, the voltage at a terminal (the junction point N) of the resistor R2 is fed back to the base of the transistor Q2 in the differential amplifier circuit 10, the differential amplifier circuit 10 operates so as to equalize the terminal voltage appearing at the resistor R2 with the reference voltage Vr and to generate a regulated onstant voltage Vo at the output terminal 12.

The constant voltage Vo is expressed as follows;

$$Vo=(r1+r2)\cdot Vr/r2$$

wherein r1 is a resistance of the resistor R1 and r2 is a resistance of the resistor R2.

FIG. 4 shows a load current Io-output voltage Vo characteristic of such a regulated power supply circuit and, as illustrated by the dotted line, the output voltage Vo decreases depending on increase of the load current. In contrast to an ideal regulation as illustrated by the solid line, the output voltage Vo decreases depending on the amount of load current as illustrated even in an actually set predetermined regulation range and the amount of decrease of the output voltage is increased as the amount of load current increases. Further, the output voltage decreasing region in the drawing is exaggerated for the sake of convenience of explanation.

The reason why such output voltage decreasing is caused is that operation currents of the pair of the differential transistors Q1 and Q2 in the differential amplifier circuit 10 unbalance and an offset of voltage between base and emit of one of the transistors is induced with respect to one of the other transistor. Due to this offset an error is caused for a coincidence detection with the reference voltage Vr.

In order to present such problem, it may be conceived to reduce the open gain of the differential amplifier circuit 10, however, if such measure is taken, a range of the regulation is narrowed. On one hand, in order to reduce unbalance of voltages between base and emitters of the differential transistors it is possible to set the open gain of the differential amplifier circuit 10 to obtain a detection rate of close to 1, however, if such measure is taken, a problem arises that the circuit is likely to oscillate.

SUMMARY OF THE INVENTION

An object of the present invention is to resolve such problems encountered in the conventional art and to provide a regulated power source circuit which suppresses a lowering of regulation voltage, even if the load current thereof increases.

A regulated power source circuit according to the present invention which achieves the above object is constituted in such a manner that a regulated power source circuit which comprises a differential amplifier circuit and a current output circuit which receives an output signal from the differential amplifier circuit, amplifies the current of the received signal and outputs the amplified signal, at the output of the current output circuit to which a load is connected a resistor circuit which is provided in parallel with the load and a dummy circuit, and by feeding back a part or all of the voltage outputted on the load via the resistor circuit to one of the inputs of the differential amplifier circuit and by feeding a constant current to the resistor circuit through application of a constant voltage at the other input of the differential amplifier circuit, the voltage outputted on the load is regulated to assume a constant value, wherein the current output circuit includes a drive stage transistor which operates when receiving at the input side thereof an output signal from one of the transistor for the differential operation in the differential amplifier circuit, a current output stage transistor which is driven by the drive stage transistor and a detection circuit which detects a drive current value of the drive stage transistor, and said dummy circuit causes to output from the other transistor forming a pair with the one transistor a current the value of which is substantially equal to that of the current outputted from the one transistor in the differential amplifier circuit to the drive stage transistor when a detection signal from the detection circuit is received.

Because the drive current of the current output stage transistor is detected by a detection circuit and a current of which value is substantially equal to that of the output signal from the one transistor is designed to be outputted to the dummy circuit from the other transistor forming a pair with the transistor at the output side of the differential amplifier circuit by means of the detection signal, the operating current of the pair of differential transistors are made equal under their operating condition. Accordingly, the voltages between the base and emitters of the one and the other of the transistors in the differential amplifier circuit are made substantially equal.

As a result, no offset is substantially caused between the base and emitters of these transistors, and an error is hardly generated during the coincidence detecting operation with respect to the reference voltage Vr in the differential amplifier circuit.

Moreover, since the detection circuit is designed to detect the current at the output side of the drive stage transistor and can be isolated from the current at the input side of the drive stage transistor without affecting thereto, a simple circuit, for example a current mirror circuit, can be used even for the detection circuit which transmits the detection signal upto the dummy circuit.

DESCRIPTION OF THE PREFERRED EMBODIMENTS

Figure 1:
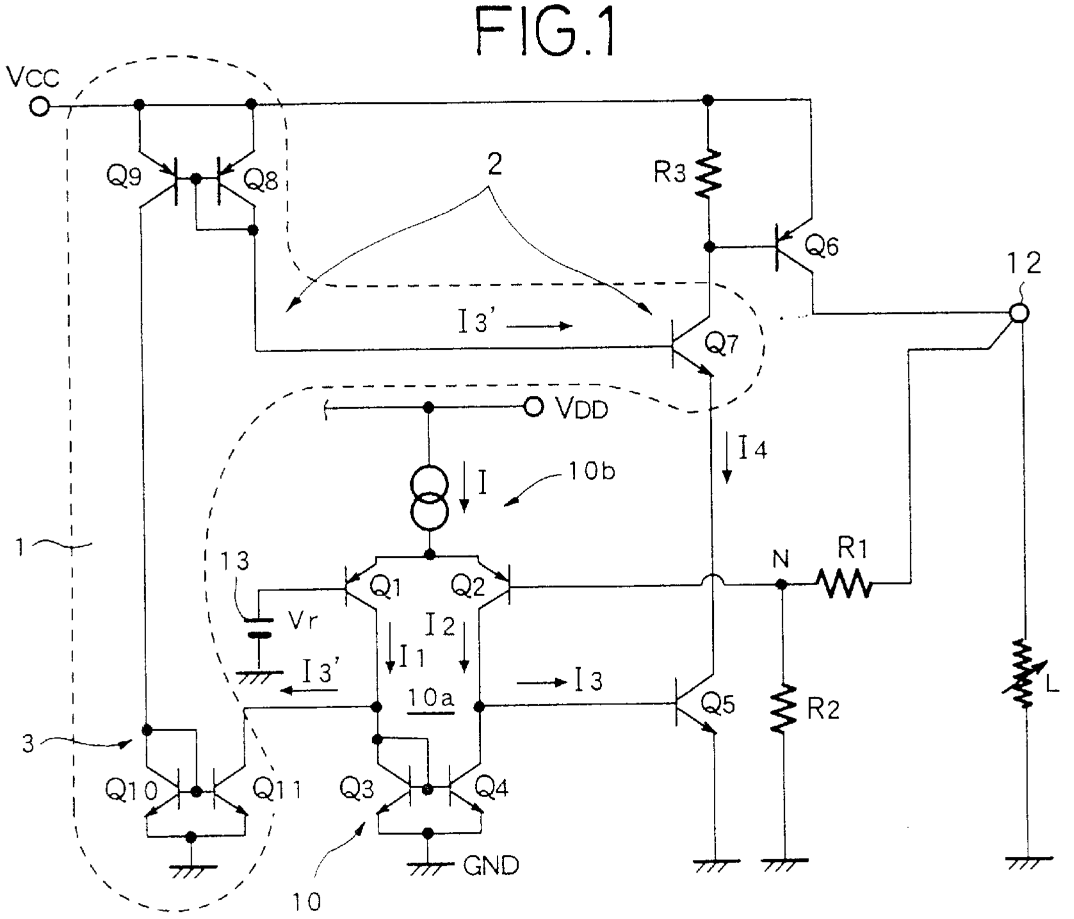
FIG. 1 is a block diagram of one embodiment of regulated power source circuits to which the present invention is applied.
Figure 3:
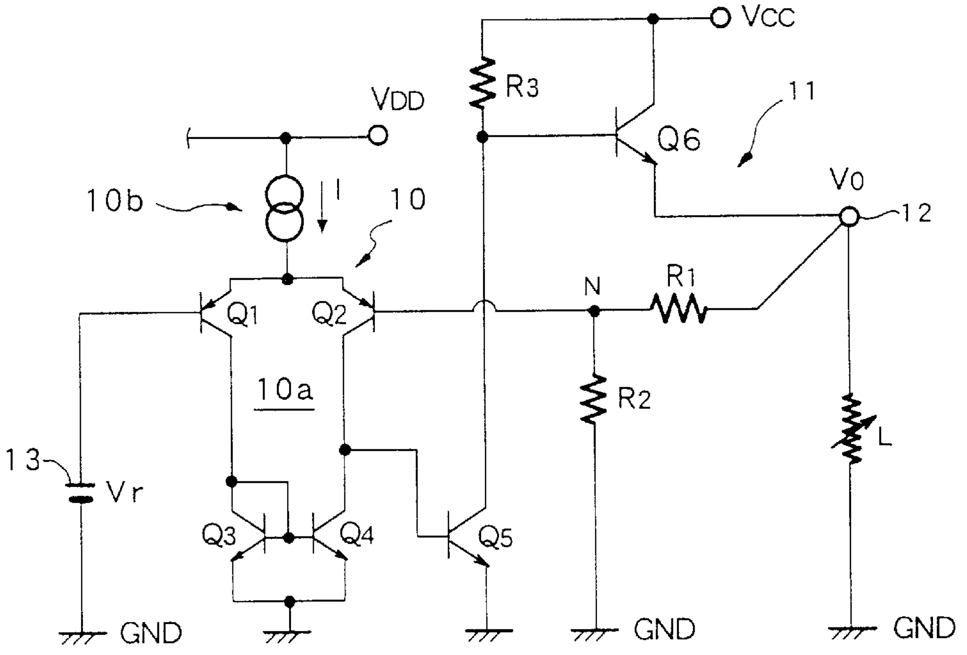
FIG. 3 is a block diagram of a conventional CMOS type regulated power source circuit; and, FIG. 4 is a view for explaining a relationship between the output current and base voltage of the conventional CMOS type regulated power source circuit.

Difference between the circuit of the embodiment shown in FIG. 1 and the circuit shown in FIG. 3 as a conventional art is that in a differential amplifier circuit shown in FIG. 1 a correction current producing circuit 1 is provided. The correction current producing circuit 1 is constituted by a current value detection circuit 2 which detects value of current flowing into the collector of the drive transistor Q5 as shown in FIG. 3, and a dummy circuit 3 which performs the equivalent operation as the drive transistor Q5. Moreover, in the present embodiment, a detection signal of the drive current detected by the current value detection circuit 2 shows the same current value as that of the base current inputted into the base of the transistor Q5. The dummy circuit 3 receives the current having the same value which is branched and sinked by the dummy circuit 3 as the output current from the side of the transistor Q1. Thereby, even from the side of the transistor Q1 the same amount of current as from the transistor Q2 is outputted.

The current value detection circuit 2 is constituted by an NPN type bipolar transistor Q7 of which collector-emitter is inserted between the base of the transistor Q6 and the collector of the transistor Q5, and a current mirror circuit. The current mirror circuit is constituted by transistors Q8 and Q9, wherein the transistor Q8 is a diode connected PNP type bipolar transistor forming the input side of the current mirror circuit of which collector is connected to the transistor Q7, and the transistor Q9 is a PNP type bipolar transistor connected in a current mirror with the transistor Q8 and forming the output side thereof. Further, the emitters of the transistors Q8 and Q9 are respectively connected to the power source line Vcc. In order to generate a current of a value same as the value of the drive current representing an output of the transistor Q5, in the current value detection circuit 2 a current having a value same as that of the output current of the transistor Q5 causes to flow between the collector and emitter (output side) of the transistor Q7, thereby a current having a value I3' substantially the same as the input current of a value I3 onto the base of the transistor Q5 is generated at the base side of the transistor Q7. Further, the thus generated current of the value I3' is transmitted to the transistor Q9 to cause to output from the collector thereof.

The dummy circuit 3 is constituted by current mirror connected NPN type bipolar transistors Q10 and Q11. The collector of diode connected transistor Q10 forming the input side thereof is connected to the collector of the transistor Q9 to receive the above mentioned detection current. The collector of the transistor Q11 forming the output side thereof is connected to the collector of the differential transistor Q1 in the differential amplifier circuit 1 to thereby sink the current having a value equal to that of the input current into the base of the transistor Q5, namely the above mentioned detection current, to the ground. Further, the emitters of the transistors Q10 and Q11 are respectively connected to the ground GND.

Herein, it is assumed that the value of the current flowing at the side of the differential amplifier Q1 is I1, the value of the current flowing at the side of the differential transistor Q2 is I2, the value of the current outputted from the transistor Q2 is I3 and the value of the drive current for the current output stage transistor Q6 is I4 which is caused to flow into the collector of the transistor Q5 by the current I3.

The current having a value I4 flows through the collector and emitter of the transistor Q5 and to the base thereof the current of the value I3 is flowing to generate the collector-emitter current. Further, the current of the value I4 also flows through the collector-emitter of the transistor Q7, and into the base of the transistor Q7 the current having a value of I3' substantially equal to the value of the base current of the transistor Q5 flows. The current of the value I3' is transferred upto the transistor Q11 via the current mirror connected transistors Q8 and Q9 and the current mirror connected transistors Q10 and Q11 to form the current having the value I3' between collector and emitter of the transistor Q11. As a result, the current of the value I3' is derived from the collector of the transistor Q1 and is sinked into the ground GND.

On the hand, a part of the output current of the current output stage transistor Q6 which is driven by the drive current I4 is fed back to the base of the transistor Q2, in that the fed back signal is applied to the base of the transistor Q6, after being converted into a voltage signal by divider resistors R1 and R2. As a result, the total of the regulated power source circuit is operated so that the base voltage of the transistor Q2 is made equal to the base voltage Vr of the transistor Q1 and the circuit is stabilized under the condition. Accordingly, the output voltage at the output terminal is regulated so as to assume the voltage Vo. Since, the differential transistor Q1 causes to flow the current of value I3' to the dummy circuit 3 like the transistor Q2, the values of the currents of these differential transistors Q1 and Q2 show $I1 \approx I2 \approx I/2$, therefore, the voltages between the base and emitters of these transistors are made equal. Accordingly, no voltage offset between the base and emitters of these transistors is induced.

In this embodiment, the current mirror circuit formed by the transistors Q10 and Q11 operates as an equivalent circuit as the drive transistor Q5 with regard to its transistor characteristics. In particular, the transistor Q11 has characteristics which permit forming a pair with the transistor Q5. In this way, by providing the dummy circuit 3, which performs the equivalent operation as the drive transistor Q5, at the side of the differential transistor Q1 in the same manner as with the differential transistor Q2, and by causing to generate the same output current as its output, currents of the transistors Q1 and Q2 are always made equal.

As a result, the voltages between the base and emitters of the transistors Q1 and Q2 are made equal, errors in connection with the coincidence detection with the reference voltage Vr is hardly induced.

Figure 2:
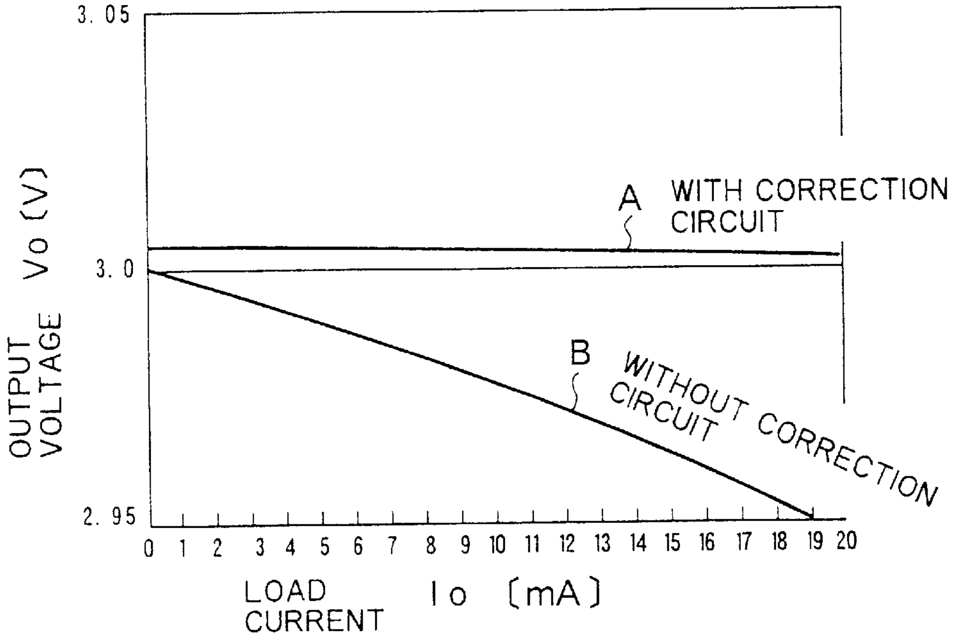
FIG. 2 is a view for explaining a relationship between the output current and base voltage in the embodiment shown in FIG. 1.
Figure 4:
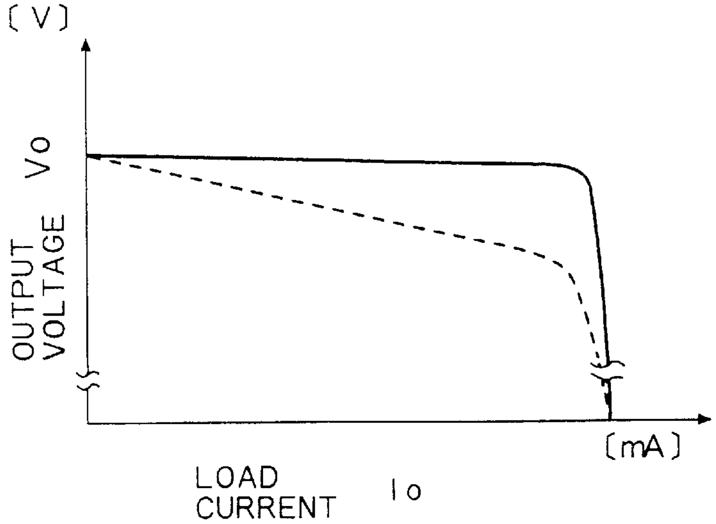

Accordingly, the lowering of the output voltage as illustrated by the dotted line in FIG. 4 is suppressed as well as the narrowing of the regulation range is also eliminated. FIG. 2 shows an example of such output current(Io)-output voltage(Vo) characteristics wherein the voltage of the power source line Vcc is 3.6V, the output voltage is Vo 3.0V and an output capacitor of 0.1 $\mu$F is connected to the output terminal 12 as the load L.

In this drawing, with regard to characteristic A with a correction circuit even if an output exceeding 20 mA is derived, the lowering of the voltage is suppressed and it is evaluated no substantial lowering is caused when comparing with characteristic B with no correction circuit.

Further, when respective transistors which form respective pairs with the transistors Q5 and Q7 are used, errors relating to the base currents I3 and I3' are further reduced.

In the current value detection circuit according to the present embodiment as has been explained hereinabove, the detection value as same as the current at the input side of the input stage is obtained by detecting the drive current of the input stage in the current output circuit, however, the detection value is not necessarily the same value as the current at the input stage. For example, if the amplification rates of the transistors Q5 and Q7 are different, the detection values are accordingly different, therefore, in such a case, an amplifier circuit and the like can be inserted in a midway circuit so that a current having a value substantially and resultantly equal to that of current at the input side of the input stage transistor (=value of the output current of the differential amplifier circuit) is to be outputted from the other transistor for differential operation in the differential amplifier circuit.

When summing up, according to the present invention, the detection circuit is provided so that the current having a value substantially the same as that of the current at the output side of the one differential transistor is to be outputted to the dummy circuit as the output current of the other differential transistor to apply the detection value onto the dummy circuit.

I claim:

1. A regulated power source circuit which comprises a differential amplifier circuit and a current output circuit which receives an output signal from said differential amplifier circuit, amplifies the current of the received signal and outputs the amplified signal, at the output of said current output circuit to which a load is connected a resistor circuit which is provided in parallel with the load and a dummy circuit, and by feeding back a part or all of the voltage outputted on the load via the resistor circuit to one of the inputs of said differential amplifier circuit and by feeding a constant current to the resistor circuit through application of a constant voltage at the other input of said differential amplifier circuit, the voltage outputted on the load is regulated to assume a constant value, wherein said current output circuit includes a drive stage transistor which operates when receiving at the input side thereof an output signal from one of transistors for the differential operation in said differential amplifier circuit, a current output stage transistor which is driven by the drive stage transistor and a detection circuit which detects a drive current value of the drive stage transistor, and said dummy circuit is provided which causes to output from the other transistor forming a pair with the one transistor in said differential amplifier circuit a current the value of which is substantially equal to that of the current outputted from the one transistor in the differential amplifier circuit to the drive stage transistor when a detection signal from said detection circuit is received.

2. A regulated power source circuit according to claim 1, wherein said detection circuit is disposed between the output terminal of the drive stage transistor and the input terminal of the current output stage transistor.

3. A regulated power source circuit according to claim 2, wherein said detection circuit includes a transistor equivalent to the drive stage transistor, the output side of the drive stage transistor and the output side detection circuit are connected in series between a power source line and the ground line, and by causing to flow the output current of the drive stage transistor to the output side of the transistor included in said detection circuit, a current having a value as same as that of the input current of the drive stage transistor is generated at the input side of the transistor included in said detection circuit.

4. A regulated power source circuit according to claim 3, wherein the transistor included in said detection circuit and the drive stage transistor are respectively PNP type bipolar transistors, the collector-emitter of the transistor included in said detection circuit and the collector-emitter of the drive stage transistor are connected in series, at the base side of the transistor included in said detection circuit the input current having a value substantially equivalent to that of the drive stage transistor as a detection current, and the detection current is sent out to said dummy circuit via a current mirror circuit.

5. A regulated power source circuit according to claim 4, wherein said dummy circuit is a current mirror circuit, a transistor at the output side of the current mirror circuit is connected to the output of the other transistor of the pair of transistors, at the input side of the current mirror circuit the detection current is received and in response thereto the output current from the other transistor is sinked.

6. A regulated power source circuit according to claim 5, wherein the pair of transistors in said differential amplifier circuit are respectively NPN type bipolar transistors, at the side of a power supply line a current source is provided, at the side of the ground line a PNP active load type bipolar transistor is included and said dummy circuit shows substantially the equivalent characteristic as the drive stage transistor.

* * * * *